US006861876B1

(12) United States Patent
Argyres

(10) Patent No.: US 6,861,876 B1
(45) Date of Patent: Mar. 1, 2005

(54) PULSE EVALUATE LOGIC-LATCH

(75) Inventor: Dimitri C. Argyres, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/397,938

(22) Filed: Mar. 25, 2003

(51) Int. Cl.[7] ............................................. H03K 19/096
(52) U.S. Cl. ......................................... 326/95; 326/98
(58) Field of Search ............................. 326/94, 95, 96, 326/97, 98; 327/210, 211, 212

(56) References Cited

U.S. PATENT DOCUMENTS

| | | | | | |
|---|---|---|---|---|---|
| 5,532,625 | A | * | 7/1996 | Rajivan | 326/98 |
| 5,936,449 | A | * | 8/1999 | Huang | 327/211 |
| 6,377,078 | B1 | * | 4/2002 | Madland | 326/95 |
| 6,393,446 | B1 | * | 5/2002 | Dhong et al. | 708/209 |
| 6,433,577 | B1 | * | 8/2002 | Wang et al. | 326/37 |
| 6,496,038 | B1 | * | 12/2002 | Sprague et al. | 326/95 |
| 6,529,045 | B2 | * | 3/2003 | Ye et al. | 326/95 |

* cited by examiner

*Primary Examiner*—Michael Tokar
*Assistant Examiner*—Linh Von Nguyen
(74) *Attorney, Agent, or Firm*—Alexander J. Neudeck

(57) ABSTRACT

A pulse clock is generated by a pulse generator from a system clock. This pulse determines when the output of a high fan-in gate is to be latched. The pulse clock also feeds a latch with no pass gate and sets the timing of the high fan-in dynamic gate. Because of the length of the active time of the pulse clock, the high fan-in dynamic gate does not have a holder.

10 Claims, 2 Drawing Sheets

PULSE EVALUATE LOGIC-LATCH

FIELD OF THE INVENTION

The present invention relates generally to circuits used in VLSI integrated Circuits, to a high fan-in dynamic logic whose output is latched.

BACKGROUND OF THE INVENTION

One problem that arises with static CMOS circuits is the difficulty implementing high fan-in logic due to the body effect and other device characteristics. This problem may be solved by multiple logic stages. However, this often adversely affects the speed of the logic function. To help with the speed problem, the high fan-in logic could be implemented using a dynamic circuit. Unfortunately, this requires that the entire logic cone preceding the latch be implemented with dynamic circuits resulting in power and noise issues. It is also possible to feed static logic into dynamic circuits, but that requires difficult timing budgets to meet the setup and hold requirements of dynamic logic. Finally, pseudo-NMOS gates can be used to implement the high fan-in logic but these have power dissipation issues.

SUMMARY OF THE INVENTION

The present invention provides a high fan-in logic function that is latched. This solution is an improvement over the other logic solutions as far as power dissipation, setup and hold issues, and noise problems in the case of high fan-in logic placed right before a latch.

A pulse clock is generated from a system clock that determines when the output of the high fan-in gate is to be latched. That pulse clock feeds a latch with no pass gate and also sets the timing of a high fan-in dynamic gate. The high fan-in dynamic gate does not have a holder.

DETAILED DESCRIPTION OF THE PREFERRED EMBODIMENTS

Figure 1:
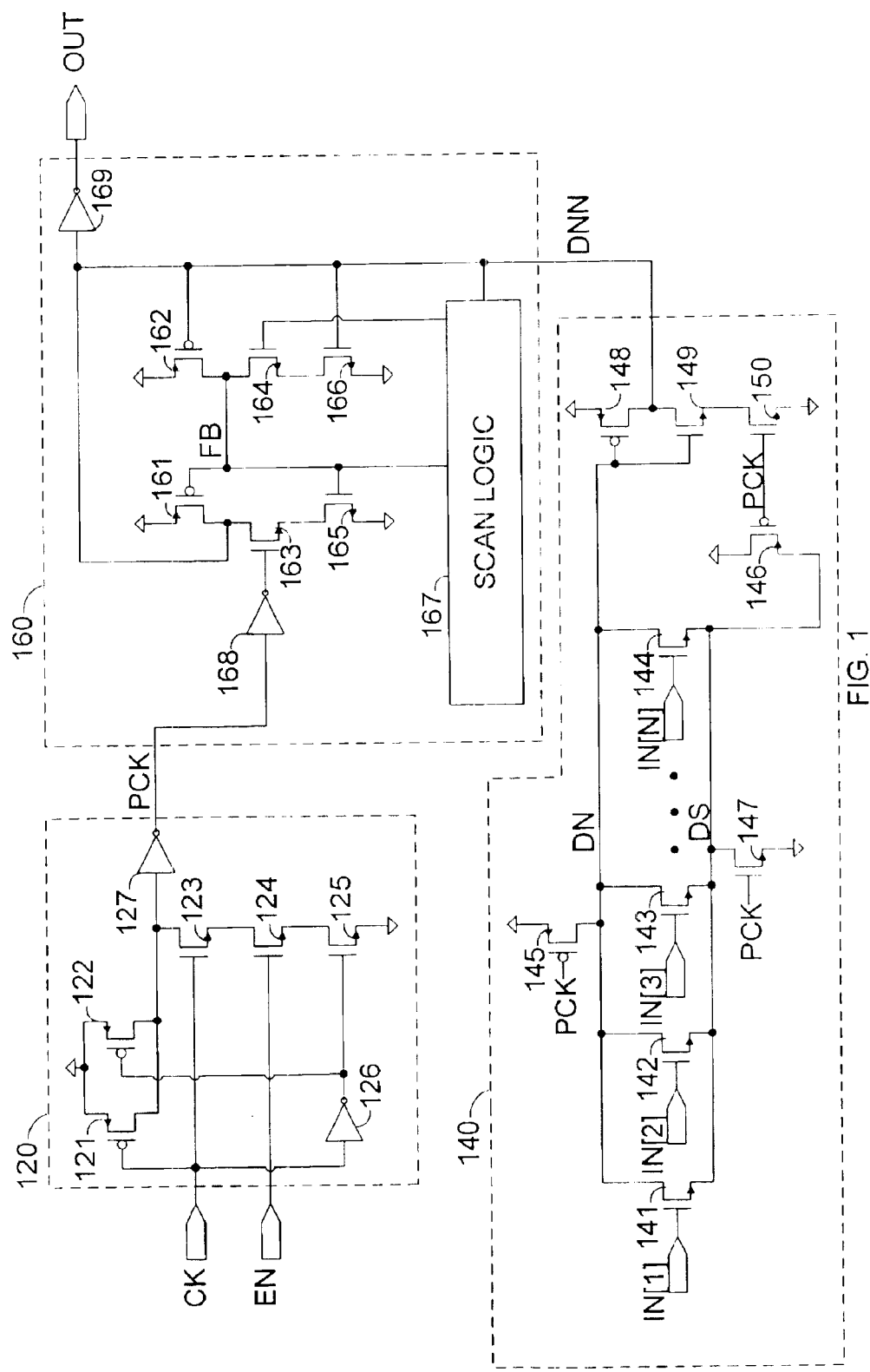
FIG. 1 is schematic illustration of a high fan-in dynamic OR-latch.
Figure 2:
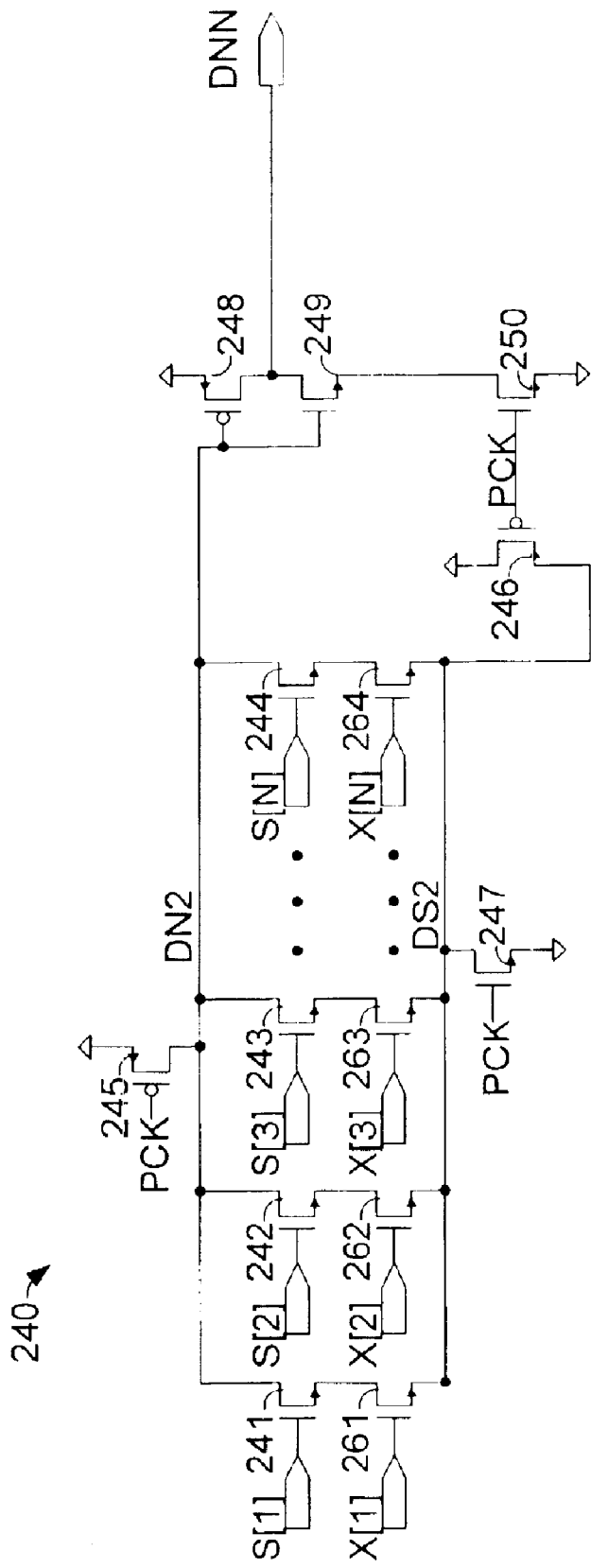
FIG. 2 is a schematic illustration of a high fan-in dynamic MUX logic stage.

FIG. 1 is schematic illustration of a high fan-in OR-latch. In FIG. 1, pulse generator 120 generates a short active high clock pulse on its output, PCK, when its enable input, EN, is high and its clock input, CK, transitions from a low to a high. The timing of latch 160 and high fan-in dynamic gate 140 are controlled by PCK. In FIG. 1, the high fan-in gate shown is an OR gate. However, other high fan-in logic functions may be implemented. For example, a high fan-in MUX is shown in FIG. 2. The circuit in FIG. 2 may be substituted for the high fan-in OR 140 in FIG. 1 to create a high fan-in MUX-latch. Similarly, other high fan-in dynamic gates may be substituted for 140 to create AND, NAND, NOR, etc. gates. Additionally, other dynamic strategies and structures such as compound dynamic gates may be used. Such compound gates can, among other things, implement extremely high fan-in logic functions or high fan-in compound logic functions such as a high fan-in AND function that is OR'd with another high fan-in AND function.

High fan-in dynamic OR gate 140 precharges when pulse clock PCK is low. Dynamic gate 140 evaluates when PCK is high. When PCK is high, the output of dynamic gate 140 is latched by latch 160. Since the pulse on PCK is typically very short compared to the cycle time of CK, the circuit is precharging for most of a clock cycle. Accordingly, the precharge transistor 145 may be made relatively small. Also note that there is no feedback circuit on node DN to hold the value of DN when it is not being actively driven. This is possible because the length of the pulse on PCK is independent of clock frequency and is of very short duration. However, a feedback circuit could be added to hold node DN if desired.

In FIG. 1, high fan-in dynamic OR gate 140 is shown comprising PFETs 145, 146, and 148, and NFETs 141, 142,143, 144, 147, 149 and 150. NFETs 141–144 are intended to represent an arbitrary number, N, of NFETs whose sources and drains are identically connected (to nodes DS and DN, respectively) and each of whose gate is connected to different input to the OR gate IN[1 ] through IN[N], respectively. The drain of PFET 145 and the gate of PFET 148 and the gate of NFET 149 are also connected to node DN. The source of PFET 145 is connected to the positive supply voltage. The gates of PFETs 145 and 146 and the gates of NFETs 147 and 150 are connected to pulse clock PCK. The drain of PFET 146 is connected to DS. The source of PFET 146 is connected to the positive supply voltage. The drain of NFET 147 is connected to DS and its source is connected to the negative supply voltage. The source of PFET 148 is connected to the positive supply voltage. The drain of PFET 148 is connected to node DNN. The drain of NFET 149 is also connected to DNN. The source of NFET 149 is connected to the drain of NFET 150. The source of NFET 150 is connected to the negative supply voltage.

Latch 160 latches the output of high fan-in dynamic gate 140, DNN when PCK pulses high. Latch 160 is comprised of inverters 168 and 169, PFETs 161 and 162, scan logic 167, and NFETs 163, 164, 165, 166. Scan logic 167 allows the state of latch 160 to be read and written for testing purposes using a scan-test methodology such as IEEE standard 1149.1. Inverter 168 inverts PCK and drives the inverted PCK onto the gate of NFET 163. The source of NFET 163 is connected to the drain of NFET 165. The drain of NFET 163 is connected to node DNN which is also connected to the drain of PFET 161, the input of inverter 169, the gate of PFET 162, the gate of NFET 166, and scan logic 167. The gate of NFET 165 is connected to feedback node FB which is also connected to the gate of PFET 161, the drains of PFET 162 and NFET 164, and scan logic 167. The source of NFETs 165 and 166 are connected to the negative supply voltage. The source of PFETs 161 and 162 are connected to the positive supply voltage. The gate of NFET 164 is connected to scan logic 167. The source of NFET 164 is connected to the drain of NFET 166. The output of inverter 169 is the output node of latch 160, OUT.

Pulse generator 120 comprises inverters 126 and 127, PFETs 121 and 122 and NFETs 123, 124, and 125. Enable input EN is connected to the gate of NFET 124 Clock input CK is connected to the input of inverter 126 and the gate of PFET 121 and the gate of NFET 123. The output of inverter 126 is connected to the gate of PFET 122 and the gate of NFET 125. The input of inverter 127 is connected to the drains of PFETs 121 and 122 and the drain of NFET 123. The source of NFET 123 is connected to the drain of NFET 124. The source of NFET 124 is connected to the drain of NFET 125. The source of NFET 125 is connected to the negative supply voltage. The sources of PFETs 121 and 122 are connected to the positive supply voltage.

FIG. 2 is a schematic illustration of a high fan-in dynamic MUX logic stage 240. In FIG. 2, high fan-in dynamic MUX 240 is shown comprising PFETs 245, 246, and 248, and NFETs 241, 242, 243, 244, 247, 249, 250, 261, 262, 263 and 264. NFETs 241–244 and 261–264 are intended to represent an arbitrary number, N, of NFETs who, in pairs, sources and drains are identically connected (i.e. NFETs 241 and 261 are identically connected to nodes DS2, DN2, and each other as NFETs 242 and 262 are connected to DS2, DN2, and each other.) and each of whose gate is connected to a different input to the MUX gate S[1] through S[N], and X[1] through X[N], respectively. The drains of NFETs 241–244 are each connected to DN2. The sources of NFETs 261–264 are connected to DS2. The sources of NFETs 241–244 are each connected to the corresponding drain of NFETs 261–264. The drain of PFET 245 and the gate of PFET 248 and the gate of NFET 249 are connected to node DN2. The source of PFET 245 is connected to the positive supply voltage. The gates of PFETs 245 and 246 and the gates of NFETs 247 and 250 are connected to pulse clock PCK. The drain of PFET 246 is connected to DS2. The source of PFET 246 is connected to the positive supply voltage. The drain of NFET 247 is connected to DS2 and its source is connected to the negative supply voltage. The source of PFET 248 is connected to the positive supply voltage. The drain of PFET 248 is connected to node DNN. The drain of NFET 249 is also connected to DNN. The source of NFET 249 is connected to the drain of NFET 250. The source of NFET 250 is connected to the negative supply voltage.

What is claimed is:

1. A dynamic logic gate, comprising:

pulse generator generating a pulse clock from a system clock;

high fan-in dynamic gate receiving said pulse clock wherein said pulse clock sets the timing of said dynamic gate and wherein said high fan-in dynamic gate is without a holder on an output node; and, latch receiving said pulse clock and also receiving a dynamic signal on said output node of said high fan-in dynamic gate, wherein said latch is without a pass gate connected to said dynamic output node.

2. The dynamic logic gate of claim 1 wherein said high fan-in dynamic gate is a high fan-in OR gate.

3. The dynamic logic gate of claim 1 wherein said high fan-in dynamic gate is a high fan-in MUX.

4. The dynamic gate of claim 1 wherein said high fan-in dynamic gate has only one output node.

5. A pulse evaluate logic-latch, comprising:

pulse generator for generating a pulse of short duration from a system clock; and, dynamic logic gate and a dynamic latch controlled by said pulse to latch an output of said dynamic logic gate, wherein said dynamic logic gate and said dynamic latch are integrated so that they share a common node and said dynamic logic gate does not have a holder on said common node and said dynamic latch and wherein said dynamic logic latch does not have a pass gate through which a signal output on said node common must pass before being latched.

6. The dynamic logic gate of claim 5 wherein said dynamic gate is a high fan-in OR gate.

7. The dynamic logic gate of claim 1 wherein said dynamic gate is a high fan-in MUX.

8. A pulse evaluate logic-latch, comprising: pulse generating means that generate a pulse of short duration from a clock means;

logic means that perform a high fan-in logic function in response to said pulse of short duration to produce an output on an output node, wherein said output node does not have a holder circuit for holding said output during said pulse of short duration; and, latching means that latch said output, wherein said output is not passed through a pass gate before being latched by a feedback circuit.

9. The dynamic logic gate of claim 5 wherein said dynamic gate is a high fan-in OR gate.

10. The dynamic logic gate of claim 1 wherein said dynamic gate is a high fan-in MUX.

* * * * *

UNITED STATES PATENT AND TRADEMARK OFFICE
CERTIFICATE OF CORRECTION

PATENT NO. : 6,861,876 B1  
APPLICATION NO. : 10/397938  
DATED : March 1, 2005  
INVENTOR(S) : Dimitri C. Argyres Page 1 of 1

It is certified that error appears in the above-identified patent and that said Letters Patent is hereby corrected as shown below:

IN THE CLAIMS

Claim 8, Column 4, line 23, insert a paragraph break after "comprising:"

Signed and Sealed this

Twentieth Day of May, 2008

JON W. DUDAS  
*Director of the United States Patent and Trademark Office*